(12) United States Patent
Freitag et al.

(10) Patent No.: US 7,433,163 B2
(45) Date of Patent: Oct. 7, 2008

(54) SEEDLAYER FOR HIGH HARD BIAS LAYER COERCIVITY

(75) Inventors: James Mac Freitag, Sunnyvale, CA (US); Mohamad Towfik Krounbi, San Jose, CA (US); Mustafa Michael Pinarbasi, Morgan Hill, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 419 days.

(21) Appl. No.: 11/353,341

(22) Filed: Feb. 13, 2006

(65) Prior Publication Data

US 2007/0188935 A1    Aug. 16, 2007

(51) Int. Cl.
G11B 5/39 (2006.01)
(52) U.S. Cl. .................................. 360/324.12
(58) Field of Classification Search .............. 360/324.1, 360/324.11, 324.12, 324.2
See application file for complete search history.

(56) References Cited

U.S. PATENT DOCUMENTS

| 5,466,522 | A | 11/1995 | Freeman et al. |
| 6,723,450 | B2 * | 4/2004 | Do et al. ..................... 428/828 |
| 6,828,036 | B1 * | 12/2004 | Munteanu et al. ......... 428/828.1 |
| 6,905,781 | B2 | 6/2005 | Ajan et al. |
| 6,944,939 | B2 * | 9/2005 | Guo et al. ................ 29/603.15 |
| 2002/0015268 | A1 * | 2/2002 | Mao et al. .............. 360/324.12 |
| 2002/0044393 | A1 | 4/2002 | Siegler |
| 2005/0014028 | A1 | 1/2005 | Umeda et al. |
| 2005/0275975 | A1 * | 12/2005 | Zhang et al. ........... 360/324.12 |
| 2006/0012925 | A1 * | 1/2006 | Pinarbasi ................. 360/324.1 |
| 2007/0206335 | A1 * | 9/2007 | Freitag et al. .......... 360/324.12 |
| 2008/0094886 | A1 * | 4/2008 | Ranjan et al. ............... 365/171 |

* cited by examiner

*Primary Examiner*—Jefferson Evans
(74) *Attorney, Agent, or Firm*—Patent Law Office of Larry Guernsey; Larry B. Guernsey (57) ABSTRACT

A seedlayer structure for a high coercivity hard bias layer is disclosed, having at least one bi-layer seedlayer, including a CrMo layer, and a W layer fabricated on the CrMo layer. A hard bias layer is fabricated on the bi-layer seedlayer. Preferably, the seedlayer structure includes two bi-layer seedlayers, which including a first CrMo layer, a first W layer fabricated on the first CrMo layer, a second CrMo layer fabricated on the first W layer, and a second W layer fabricated on the second CrMo layer. Also disclosed is a high coercivity hard bias stack structure, a magnetic read head for a disk drive having a high coercivity hard bias stack structure and a method for fabricating a coercivity hard bias layer for a magnetic read head.

22 Claims, 8 Drawing Sheets

SEEDLAYER FOR HIGH HARD BIAS LAYER COERCIVITY

BACKGROUND OF THE INVENTION

1. Field of the Invention

The present invention relates generally to manufacture of heads for data storage devices and more specifically to a read head for use with a perpendicular write head in a magnetic head for a hard disk drive.

2. Description of the Prior Art

Data has been conventionally stored in a thin media layer adjacent to the surface of a hard drive disk in a longitudinal mode, i.e., with the magnetic field of bits of stored information oriented generally along the direction of a circular data track, either in the same or opposite direction as that with which the disk moves relative to the transducer.

More recently, perpendicular magnetic recording systems have been developed for use in computer hard disk drives. A typical perpendicular recording head includes a trailing write pole, a leading return or opposing pole magnetically coupled to the write pole, and an electrically conductive magnetizing coil around the write pole. In this type of disk drive, the magnetic field of bits of stored information are oriented normal to the plane of the thin film of media, and thus perpendicular to the direction of a circular data track, hence the name.

Media used for perpendicular recording typically include a hard magnetic recording layer and a soft magnetic underlayer which provides a flux path from the trailing write pole to the leading opposing pole of the writer. Current is passed through the coil to create magnetic flux within the write pole. The magnetic flux passes from the write pole tip, through the hard magnetic recording track, into the soft underlayer, and across to the opposing pole, completing a flux loop.

Perpendicular recording head designs have the potential to support much higher linear densities than conventional longitudinal designs. Magnetization transitions on the bilayer recording disk are recorded by a trailing edge of the trailing pole and reproduce the shape of the trailing pole projection on the media plane, thus the size and shape of the pole tip is of crucial importance in determining the density of data that can be stored. Perpendicular magnetic recording is expected to supersede longitudinal magnetic recording due to the ultra-high density magnetic recording that it enables. This high density of magnetic flux can have an effect on the stability of the read head of the disk drive.

There are two configurations of read head in common use in the industry today. These are called Current Perpendicular to the Plane (CPP), and Current In the Plane (CIP). In the CPP configuration, the layers above and below the read sensor are made of conducting material which act as electrodes supplying current to the read sensor which lies between them. For purposes of this discussion, the read head will be assumed to be a CIP configuration.

Figure 5:
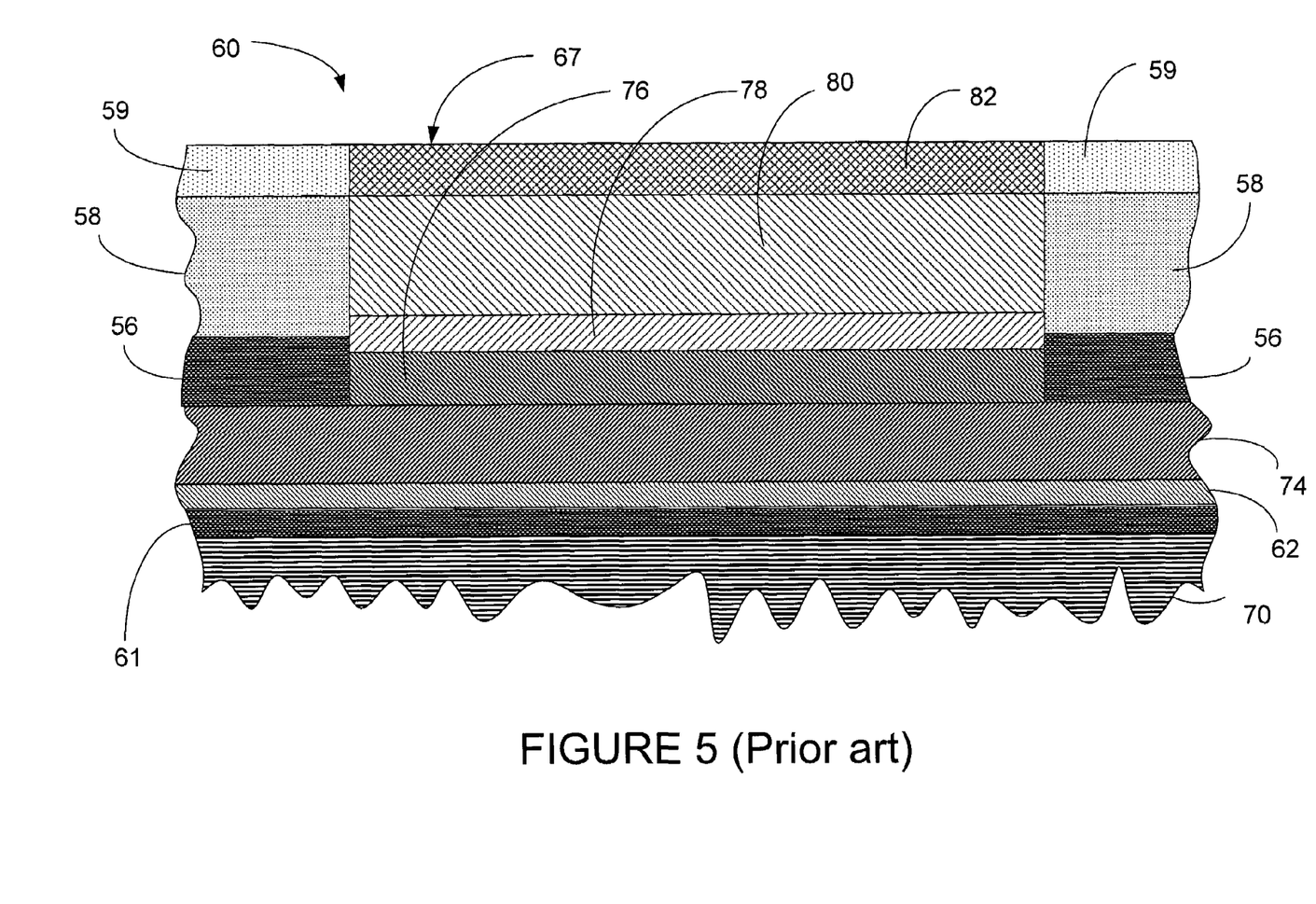
FIG. 5 is a front plan view of an exemplary read head of the prior art.

A read head sensor 60 is generally formed of a wafer stack 67, such as is generally shown in a front plan view as seen from the Air Bearing Surface (ABS) in FIG. 5 (prior art). Shield layer S1 61 is formed on a substrate 70, followed by a gap layer, designated G1 62. The wafer stack 67 is formed on the G1 62 layer and includes an antiferromagnetic layer 74, a pinned layer 76, a spacer layer 78, a free magnetic layer 80, and a cap layer 82. A G2 layer is formed on the cap layer, but is not shown here.

Adjacent to the wafer stack 67, the read head 60 typically includes two hard bias layers 58 on either side of the wafer stack 67. Each hard bias layer 58 is formed on a seedlayer 56, and in a CIP configuration, a lead layer 59 is fabricated on the hard bias layer 58.

Generally, the magnetic moment of the free layer is free to rotate laterally within the layer with respect to the ABS from a quiescent or zero bias point position in response to magnetic field signals from data bits located on the rotating magnetic disk. The sensitivity of the sensor is quantified as the magnetoresistive coefficient dR/R where dR is the change in resistance of the sensor from minimum resistance to maximum resistance and R is the resistance of the sensor at minimum resistance.

The free layer material is very soft material, magnetically speaking, with very low coercivity, which is a measure of the minimum field strength necessary to make changes in the orientation of the magnetic domains. The free layer material necessarily must have this quality, as it is this layer's changes in magnetic alignment in response to the magnetic flux in the data bits in the data disk that leads to changes in resistance, which is how the data is read. This free layer material may therefore very easily fall into a multidomain state, where alignment of magnetic domains is not uniform. It is desirable however that the magnetization of the free layer be biased to be uniform throughout the entire layer. When the current is conducted through the sensor without magnetic field signals from the rotating magnetic disk, this is known as the quiescent position of the magnetic moment of the free layer. The preferred biased direction is parallel to the ABS.

If the free layer material is allowed to assume a multidomain state, the read signal will be degraded. In order to maintain the biased alignment during the quiescent state to produce better signal quality, there must be some external field applied to the free layer. The application of this external field is known as "stabilization".

Permanent magnet films, referred to as "hard bias layers", have been used to maintain the single-domain state in the free layer. The magnetic biasing field provided by the bias film must be sufficiently high to achieve stabilization and must itself be sufficiently stable to maintain its magnetization in the presence of high magnetic flux from the media which is being read.

Figure 8:
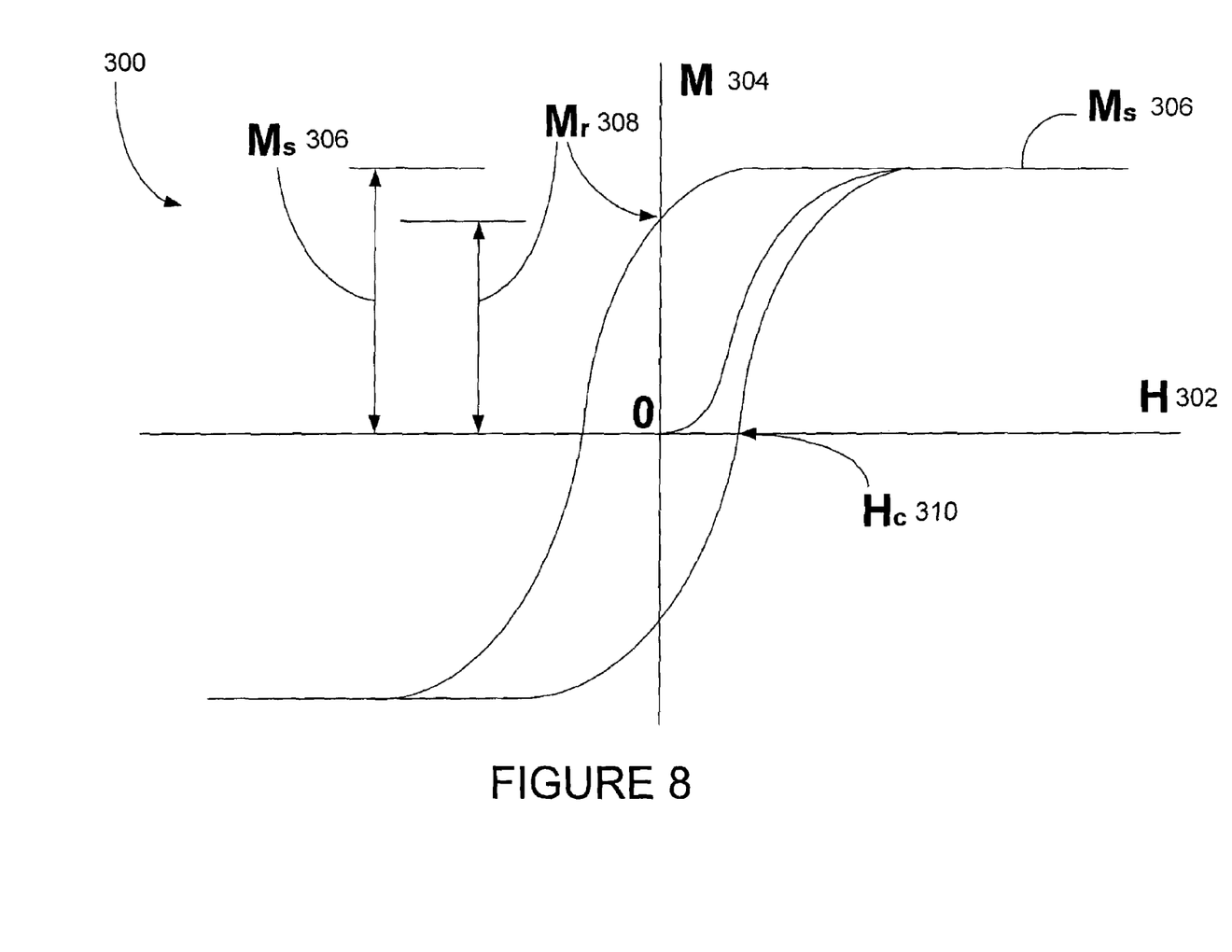
FIG. 8 is a graph of an exemplary hysteresis loop of a magnetic material.

A plot of the magnitude of the magnetization or flux density as a function of applied magnetic field is shown in a hysteresis loop 300, as illustrated in FIG. 8. A magnetic field H 302 has been applied to a sample of magnetic material, and the component of magnetization in the direction of H has been plotted as M 304. The maximum value of magnetization reached is called the saturation magnetization $M_s$ 306, where the application of further H produces no increase in M. When the field H is reduced to zero, the value of M at this point is called the remanent magnetization $M_r$ 308. The value of H for zero magnetization is called the coercive force or coercivity $H_c$ 310. Squareness is a measure of the ratio of the remanent magnetization $M_r$ to the saturation magnetization $M_s$.

Figure 9:
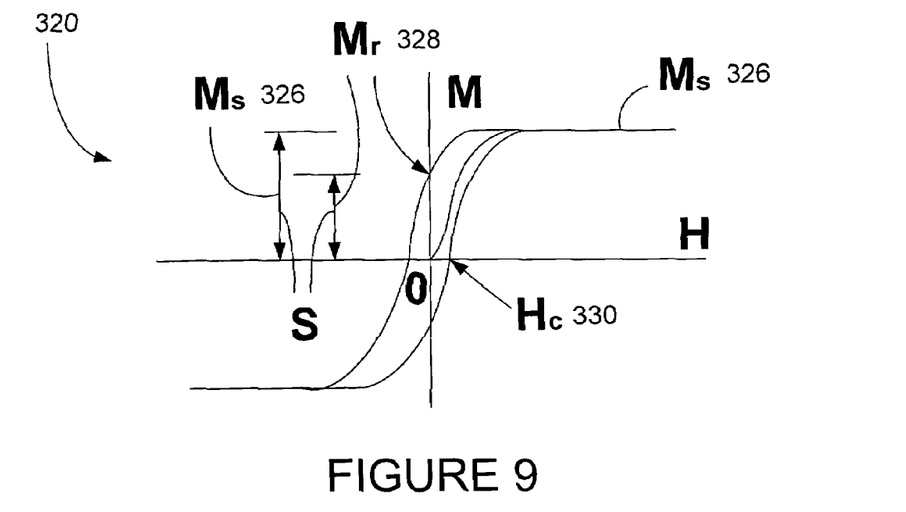
FIG. 9 is a graph of a hysteresis loop of an exemplary soft magnetic material.
Figure 10:
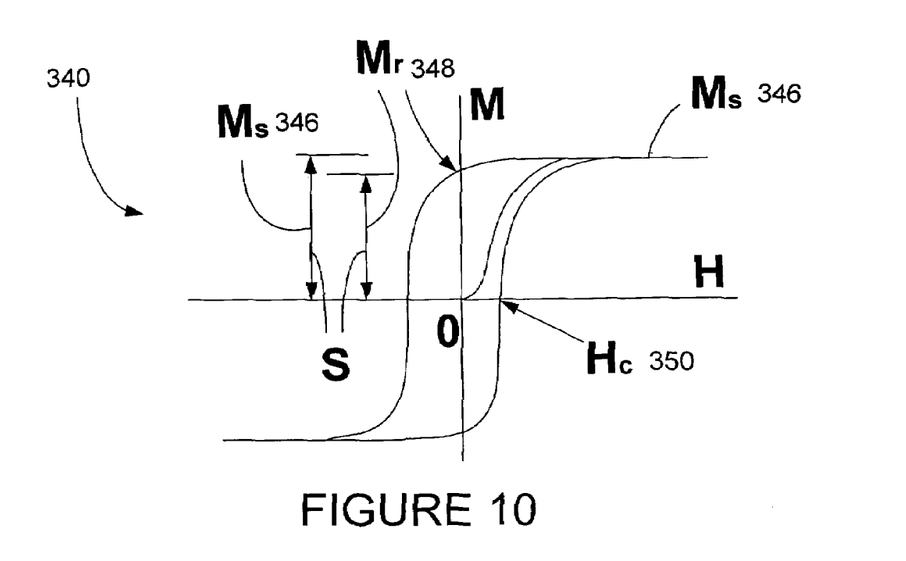
FIG. 10 is a graph of a hysteresis loop of a hard magnetic material, such as the high coercivity hard bias layer of the present invention.

Ferromagnetic materials are broadly divided into soft magnetic materials and hard magnetic materials. Hard magnetic materials exhibit low initial permeability and high coercive force and soft magnetic materials exhibit high initial permeability and low coercive force. FIG. 9 shows a hysteresis loop 320 for an exemplary soft magnetic material and FIG. 10 shows a hysteresis loop 340 for an exemplary hard magnetic material. It can be seen that the coercivity value $H_c$ 350 is larger for the hard magnetic material than the coercivity value $H_c$ 330 for the soft magnetic material. Squareness, being a ratio of the remanent magnetization to the saturation magnetization, is a dimensionless figure of merit that gauges the quality of the hard magnetic film.

The coercivity value $H_c$ thus can be considered as a measure of how well a magnetic material maintains its magnetization in the presence of magnetic flux fields. As referred to above, the hard bias layer is required to have high coercivity, so that it is stable in the presence of magnetic flux, and can therefore stabilize the free layer by its biasing effect. This has become particularly critical for perpendicular recording apparatus where the read head is exposed to high levels of magnetic flux from the recorded media. It has been found that the choice of the seedlayer upon which the permanent magnetic film of the hard bias layer is to be formed has a great effect on the coercivity of the finished hard bias layer.

Tungsten (W) has been used as a very thin layer between Cr and the hard bias material to boost the coercivity. For example, the coercivity of a structure of a seed layer of Cr with a layer of CoPt hard bias material has been found to be around 1600 Oe. However when a 5Å layer of tungsten is fabricated upon the Cr layer followed by the CoPt layer, the coercivity is increased to more than 2200 Oe. Typical squareness values of 0.83 are obtained by using this structure containing tungsten. However, it is desired that higher coercivity levels be achieved to provide increased stability of the read head for perpendicular recording purposes.

Thus there is a need for a magnetic read sensor having a hard bias layer with improved coercivity and squareness in order to improve read head stability and overall disk drive performance.

SUMMARY OF THE INVENTION

The present invention is a seedlayer structure for high coercivity hard bias layer, having at least one bi-layer seedlayer, including a CrMo layer, and a W layer fabricated on the CrMo layer. A hard bias layer is fabricated on the bi-layer seedlayer. Preferably, the seedlayer structure includes two bi-layer seedlayers, which including a first CrMo layer, a first W layer fabricated on the first CrMo layer, a second CrMo layer fabricated on the first W layer, and a second W layer fabricated on the second CrMo layer.

Also disclosed is a high coercivity hard bias stack structure, a magnetic read head for a disk drive having a high coercivity hard bias stack structure, and a method for fabricating a high coercivity hard bias layer for a magnetic read head.

It is an advantage of the seed layer structure of the present invention that the coercivity of the hard bias layer is increased.

It is another advantage of the seed layer structure of the present invention that the squareness of the hard bias layer is increased It is a further advantage of the seed layer structure of the present invention that the stability of the free layer is increased.

It is yet another advantage of the seed layer structure of the present invention that the bias of the free layer toward a single magnetic domain state is improved.

It is still another advantage of the seed layer structure of the present invention that the stability of the read head is improved.

These and other features and advantages of the present invention will no doubt become apparent to those skilled in the art upon reading the following detailed description which makes reference to the several figures of the drawing.

IN THE DRAWINGS

The following drawings are not made to scale as an actual device, and are provided for illustration of the invention described herein.

DETAILED DESCRIPTION OF THE PREFERRED EMBODIMENTS

Figure 1:
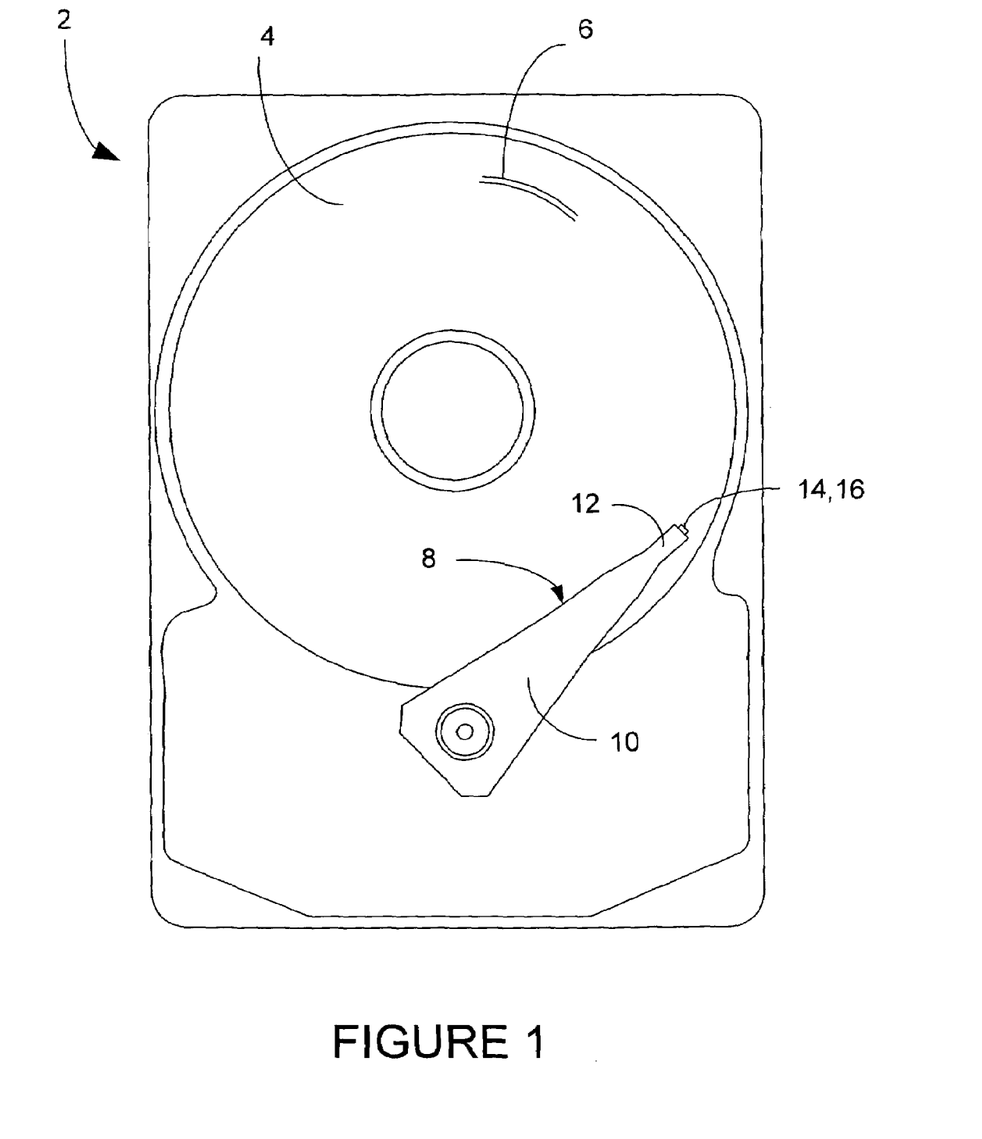
FIG. 1 shows a top plan view of an exemplary disk drive.
Figure 2:
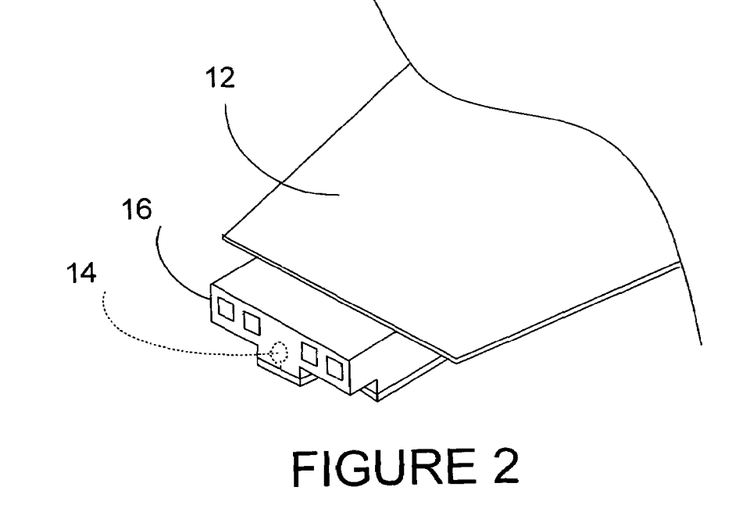
FIG. 2 illustrates a perspective view of view of an exemplary slider and suspension.

An exemplary magnetic disk drive 2 is shown generally in FIG. 1, having one or more magnetic data storage disks 4, with data tracks 6 which are written and read by a data read/write device 8. The data read/write device 8 includes an actuator arm 10, and a suspension 12 which supports one or more magnetic heads 14 included in one or more sliders 16. FIG. 2 shows a slider 16 in more detail being supported by suspension 12. The magnetic head 14 is shown in dashed lines, and in more detail in FIGS. 3 and 4. The magnetic head 14 includes a coil 18.

The slider which will be discussed below includes a magnetic head 14 having a write head portion that is of a configuration known as a perpendicular head. In this type of disk drive, the magnetic field of data bits of stored information are oriented normally to the plane of the thin film disk media, and thus perpendicular to the direction of a circular data track, hence the name. A typical perpendicular recording head includes a trailing write pole, a leading return or opposing pole magnetically coupled to the write pole, and an electrically conductive magnetizing coil surrounding the write pole.

Figure 3:
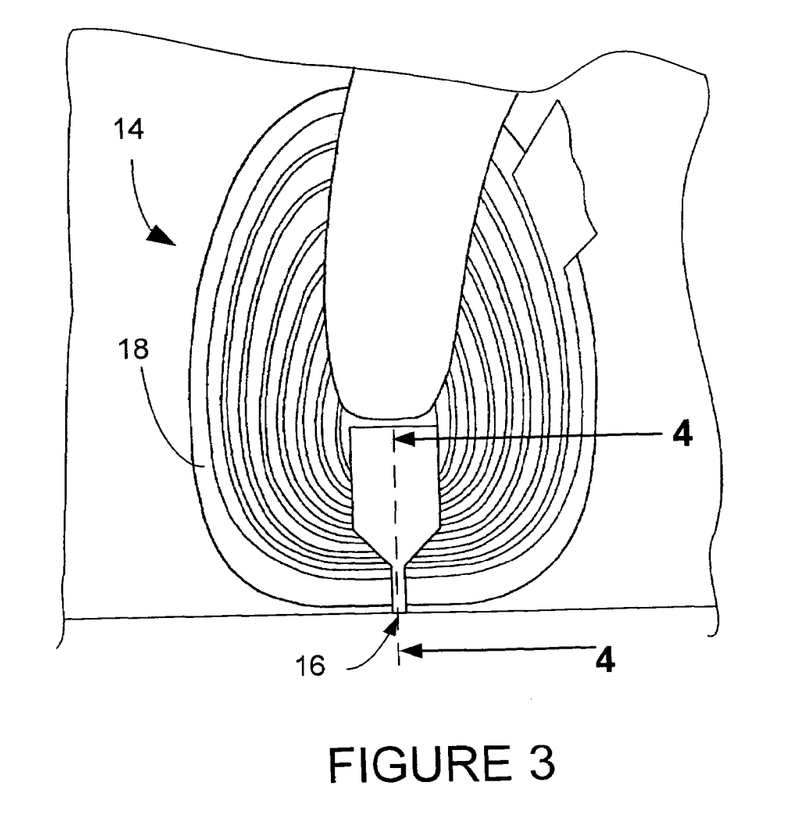
FIG. 3 shows a top plan view of an exemplary read/write head.
Figure 4:
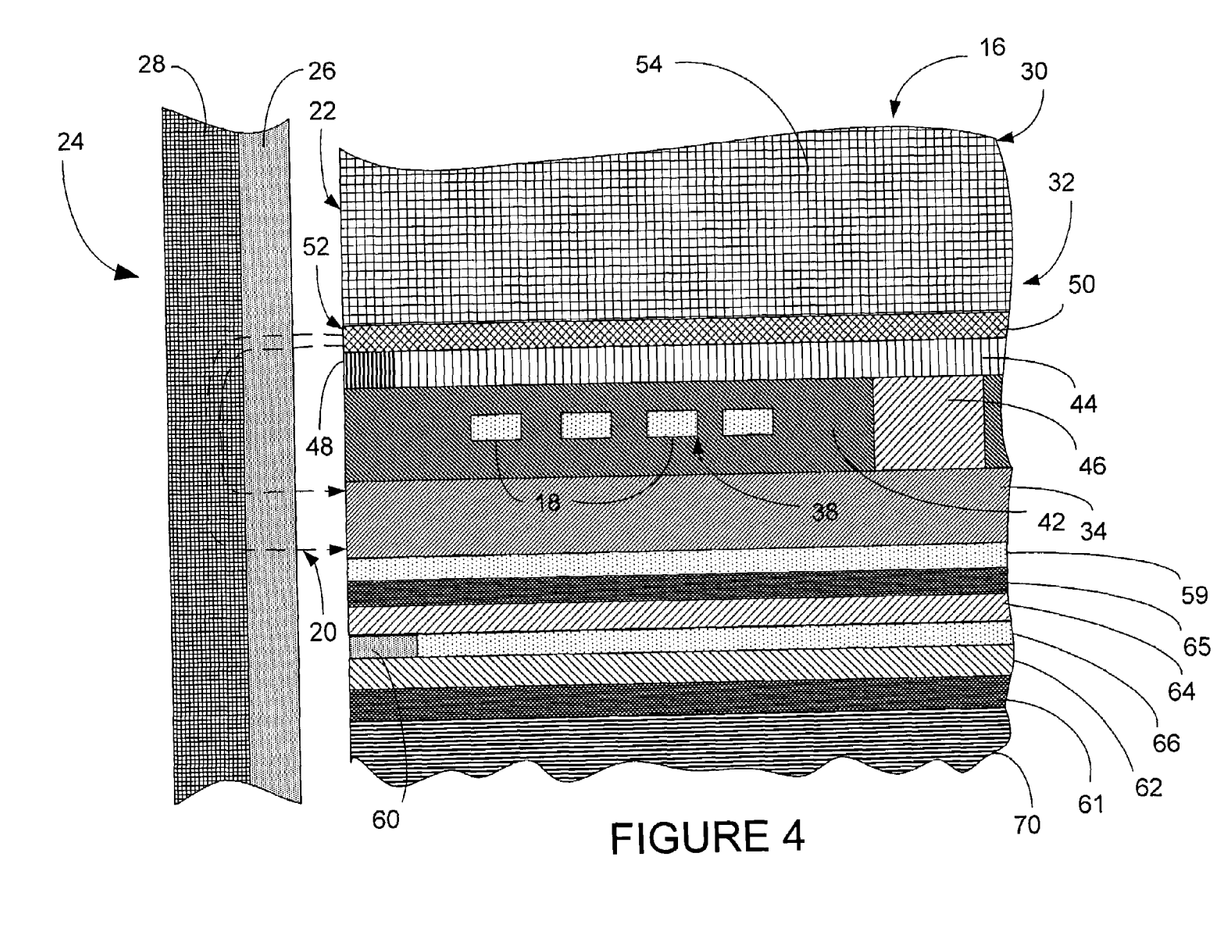
FIG. 4 is a cross-section view of an exemplary magnetic perpendicular write head.

FIG. 4 is a side cross-sectional diagram of a representative perpendicular magnetic head 30. As depicted in FIGS. 3 and 4, the slider 16 has an air bearing surface (ABS) 22 which flies above the surface of a hard disk 24. The disk 24 includes a high coercivity magnetic layer, also referred to as the hard layer 26 that is fabricated on top of a magnetically soft layer 28.

The write head portion includes a first magnetic pole P1 34. An induction coil structure 38, which includes coils 18, is fabricated upon the P1 pole 34. The coil turns 18 are typically formed within electrical insulation layers 42. A second magnetic pole layer, typically termed a P2 shaping layer 44, is fabricated on top of the induction coil structure 38. A magnetic back gap piece 46 joins the back portions of the P1 pole 34 and the P2 shaping layer 44, such that magnetic flux can flow between them. The P2 shaping layer 44 is fabricated so that a gap 48 is left between it and the rest of the ABS 22, and an alumina fill is deposited across the surface of the wafer which results in filling the gap 48 in front of the P2 shaping layer 44. A P3 layer 50, also called a probe layer, includes a P3 pole tip 52, and is in magnetic flux communication with the P2 shaping layer 44. The P2 shaping layer 44 channels and directs the magnetic flux into the P3 pole tip 52.

Electrical current flowing through the induction coil structure 38 will cause magnetic flux 20 to flow through the magnetic poles 34, 52 of the head, where the direction of magnetic flux flow depends upon the direction of the electrical current through the induction coil. In one direction, current will cause magnetic flux 20 to flow through the P2 shaping layer 44 through the P3 layer 50 to the narrow pole tip 52 into the hard layer 26 and soft layer 28 of the hard disk 24. This magnetic flux 20 causes magnetized data bits to be recorded in the high coercivity layer hard layer 26 where the magnetic field of the data bits is perpendicular to the surface of the disk 24. The magnetic flux then flows into the magnetically soft underlayer 28 and disperses as it loops back towards the P1 pole 34. The magnetic flux then flows through the back gap piece 46 to the P2 shaping layer 44, thus completing a magnetic flux circuit.

The perpendicular magnetic head 30 also includes a read head 60. The read head 60 can be of two different configurations, namely CIP (Current In the Plane) or CPP (Current Perpendicular to the Plane) and the present invention maybe be practiced in either configuration.

For the present discussion it will be assumed that the read head 60 uses a CIP configuration, in which the current flows from side to side through the elements, as opposed to a CPP configuration, where the current flows from top to bottom. For CIP read heads, the read head 60 is generally sandwiched between two insulation layers, usually designated G1 62 and G2 64 which are made of non-conductive material, to keep the circuit from shorting out. The G1 and G2 layers are themselves generally sandwiched between magnetic shield layers S1 61 and S2 65. There is also typically another insulation layer 59 beneath the P1 pole 34 of the write head. The S1 61 shield layer is also typically fabricated on a substrate layer 70.

Figure 6:
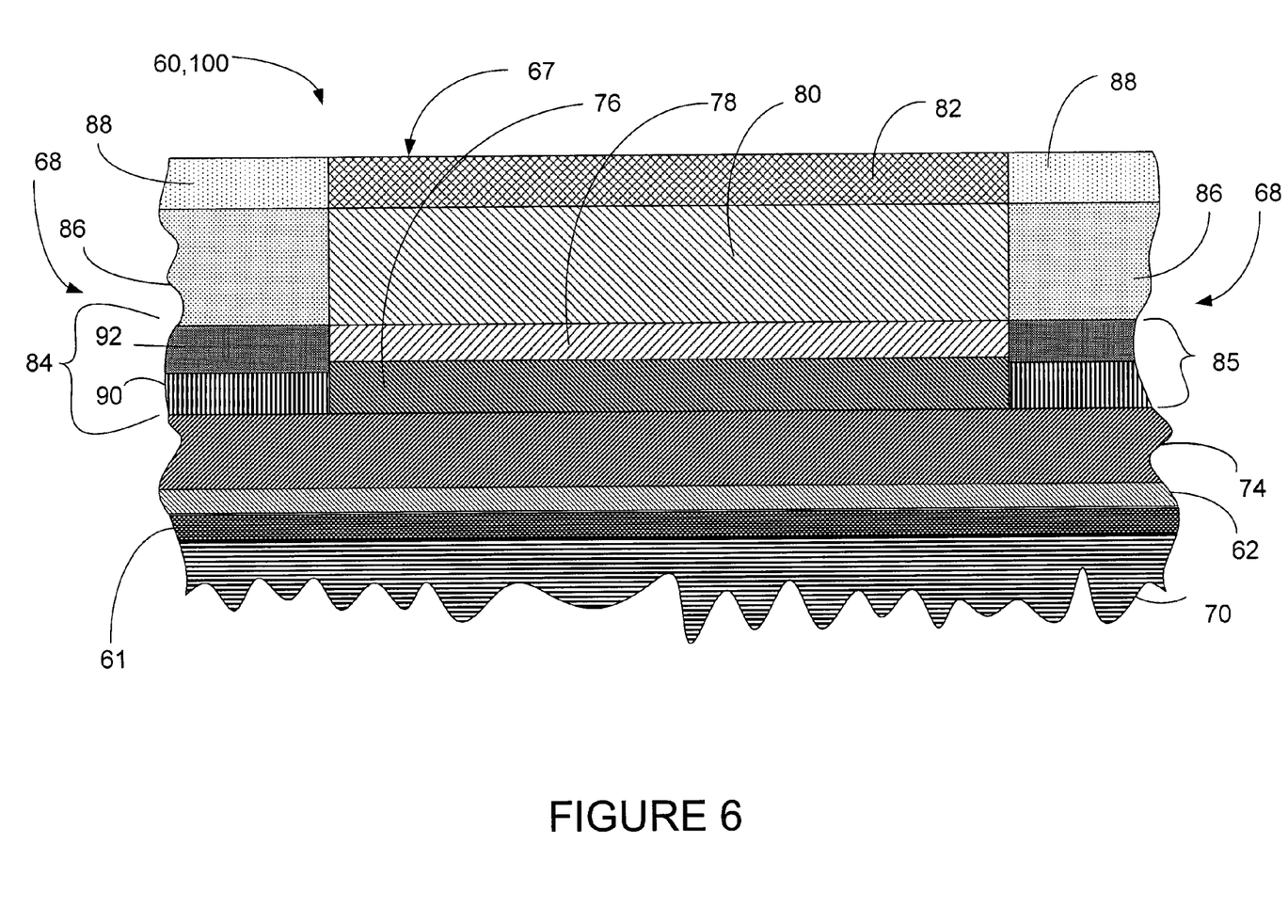
FIG. 6 is a front plan view of an exemplary read head having a bi-layer seedlayer of the present invention.
Figure 7:
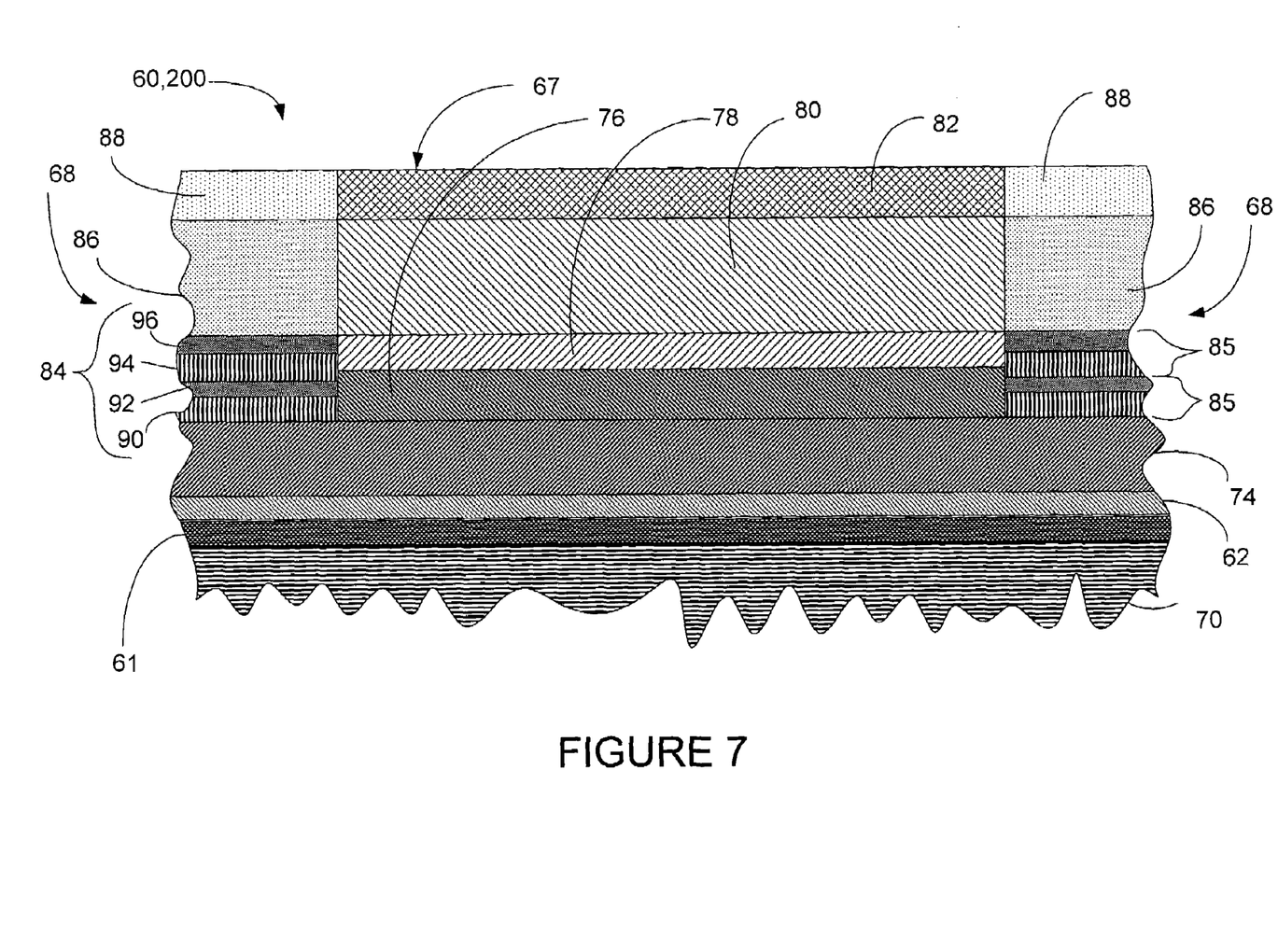
FIG. 7 is a front plan view of an exemplary read head having a multiple bi-layer seedlayer of the present invention.

FIGS. 6 and 7 show front plan views of a first embodiment 100 and second embodiment 200 of the read sensor 60 as seen from the Air Bearing Surface (ABS). The read heads 100, 200 can be thought of as generally including a wafer stack 67 and at least one hard bias stack structure 68. The preferred configuration is of two hard bias stack structures 68, which are disposed on either side of the wafer stack 67.

Shield layer S1 61 is formed on a substrate 70, followed by a gap layer, designated G1 62 in the previous discussion. The wafer stack 67 is formed on the G1 62 layer and includes an antiferromagnetic layer 74, a pinned layer 76, a spacer layer 78, a free magnetic layer 80, and a cap layer 82. The G2 layer is formed on the cap layer, but is not shown here.

As mentioned above, the read heads 100, 200 preferably include two hard bias stack structures 68 located on either side of the wafer stack 67. Each hard bias stack structure 68 includes a seedlayer structure 84, with a hard bias layer 86 formed on the seedlayer structure 84. Electrical leads 88 are then formed on the hard bias layer 86. The hard bias layer 86 is preferably aligned with the free layer 80, in order to stabilize the free layer material, as discussed above. The hard bias layer 86 is preferably made from Co alloys and CoPt alloys and CoPtX ternary alloys such as where X=Cr.

The seedlayer structure 84 of the present invention is used to produce a hard bias layer 86 with high coercivity. The first embodiment 100 shown in FIG. 6 includes a bi-layer seedlayer 85 which includes a layer of CrMo 90, followed by a layer of W 92. The coercivity of this bi-layer seedlayer 85 has been measured to be nearly 2200 Oe, and it produces a Squareness of approximately 0.82. It is preferred that the thickness of the layer of CrMo 90 lies in the range of 30-100 Å, the thickness of the layer of W lies in the range of 3-20 Å.

A second embodiment 200 is shown in FIG. 7 and includes two bilayer seedlayers 85, thus including a first layer of CrMo 90, followed by a first layer of W 92, a second layer of CrMo 94 and a second layer of W 96. The coercivity of this seedlayer structure 84 is exceptionally high and is illustrated in FIG. 10. FIG. 10 shows a hysteresis loop 340 for the high coercivity hard bias layer of the present invention having two bilayer seedlayers, and can be compared with FIG. 9, which shows a hysteresis loop 320 for an exemplary soft magnetic material. It can be seen that the coercivity value $H_c$ 350 is larger for the high coercivity hard bias layer than the coercivity value $H_c$ 330 for the soft magnetic material, and that the remanent magnetization $M_r$ 348 compared to the saturation magnetization $M_s$ 346 for the high coercivity hard bias layer is also higher than the remanent magnetization $M_r$ 328 compared to the saturation magnetization $M_s$ 326 for the soft material. Thus the squareness value, $(M_r/M_s)$ is also higher for the hard magnetic material. $H_c$, is measured in units of Oersteds (Oe), and squareness, being a ratio, is a dimensionless figure of merit.

The coercivity of this seedlayer structure 84 of the present invention has been measured to be more than 2800 Oe and it produces a Squareness of at least 0.84, which can be compared to typical values of 2200 Oe and Squareness of 0.82 for prior art hard bias layers. This exceptionally high coercivity thus increases the stability of the hard bias layers 86 and in turn the stability of the biased condition of the free layer 80. With increased stability, the read head and disk drive as a whole produces fewer errors and better performance.

No attempt has been made to depict the layers of the seedlayer stack 84 in proper proportion in the figures. It is preferred that the thickness of first layer of CrMo 90 lies in the range of 5-20 Å, the thickness of first layer of W lies in the range of 3-20 Å the thickness of the second layer of CrMo 94 lies in the range of 30-100 Å, and the thickness of the second layer of W 96 lies in the range of 3-20 Å.

It should also be understood that although the above discussion has involved a CIP read head for a perpendicular head, that the present seedlayer stack and hard bias stack structure may also be used in CPP configurations and for longitudinal as well as perpendicular heads in either CIP or CPP configurations.

While the present invention has been shown and described with regard to certain preferred embodiments, it is to be understood that modifications in form and detail will no doubt be developed by those skilled in the art upon reviewing this disclosure. It is therefore intended that the following claims cover all such alterations and modifications that nevertheless include the true spirit and scope of the inventive features of the present invention.

What is claimed is:

1. A magnetic head including a seedlayer structure for a high coercivity hard bias layer, comprising:
   at least one bi-layer seedlayer, including:
   a CrMo layer; and
   a W layer fabricated on said CrMo layer.

2. The magnetic head of claim 1, wherein said the thickness of said CrMo layer lies in the range of 30-100 Å.

3. The magnetic head of claim 1, wherein said the thickness of said W layer lies in the range of 3-20 Å.

4. The magnetic head of claim 1, further comprising:
   two bi-layer seedlayers, including:
   a first CrMo layer;
   a first W layer fabricated on said first CrMo layer;
   a second CrMo layer fabricated on said first W layer; and
   a second W layer fabricated on said second CrMo layer.

5. The magnetic head of claim 4, wherein said the thickness of said first CrMo layer lies in the range of 5-20 Å.

6. The magnetic head of claim 4, wherein said the thickness of said first W layer lies in the range of 3-20 Å.

7. The magnetic head of claim 4, wherein said the thickness of said second CrMo layer lies in the range of 30-100 Å.

8. The magnetic head of claim 4, wherein said the thickness of said second W layer lies in the range of 3-20 Å.

9. A high coercivity hard bias stack structure of a magnetic head, comprising:
   at least one bi-layer seedlayer, including:
   a CrMo layer;
   a W layer fabricated on said CrMo layer; and
   a hard bias layer being disposed upon said W layer.

10. The high coercivity hard bias stack structure of claim 9, further comprising:
    two bi-layer seedlayers, including:
    a first CrMo layer;
    a first W layer fabricated on said first CrMo layer;
    a second CrMo layer fabricated on said first W layer; and
    a second W layer fabricated on said second CrMo layer.

11. The high coercivity hard bias stack structure of claim 9, wherein said hard bias layer is fabricated from material selected from the group consisting of Co alloys and CoPt alloys and CoPtX ternary alloys such as where X =Cr.

12. A magnetic head for a disk drive, comprising:
    a wafer stack comprising;
    an AFM layer;
    a pinned layer fabricated on said AFM layer;
    a spacer layer fabricated on said pinned layer;
    a free layer fabricated on said spacer layer;
    a cap layer fabricated on said free layer; and
    at least one hard bias stack structure being disposed adjacent to said wafer stack, said least one hard bias stack structure comprising;
    at least one bi-layer seedlayer, including:
    a CrMo layer; and
    a W layer fabricated on said CrMo layer; and
    a hard bias layer fabricated on said seedlayer.

13. The magnetic head of claim 12, wherein said least one hard bias stack structure further comprises:
    two bi-layer seedlayers, including:
    a first CrMo layer;
    a first W layer fabricated on said first CrMo layer;
    a second CrMo layer fabricated on said first W layer; and
    a second W layer fabricated on said second CrMo layer.

14. The magnetic head of claim 12, wherein;
    said hard bias stack is included within a head in a CIP configuration.

15. The magnetic head of claim 12, wherein;
    said hard bias stack is included within a head in a CPP configuration.

16. A disk drive comprising:
    at least one hard disk;
    at least one magnetic head adapted to fly over said hard disk for writing data on said hard disk, and having an air bearing surface, said magnetic head including:
    a magnetic read head, including:
    a wafer stack including;
    an AFM layer;
    a pinned layer fabricated on said AFM layer;
    a spacer layer fabricated on said pinned layer;
    a free layer fabricated on said spacer layer;
    a cap layer fabricated on said free layer; and
    at least one hard bias stack structure adjacent to said wafer stack, said least one hard bias stack structure including;
    at least one bi-layer seedlayer, including:
    a CrMo layer; and
    a W layer fabricated on said CrMo layer; and
    a hard bias layer fabricated on said seedlayer structure.

17. The disk drive of claim 16, wherein said least one hard bias stack structure further comprises:
    two bi-layer seedlayers, including:
    a first CrMo layer;
    a first W layer fabricated on said first CrMo layer;
    a second CrMo layer fabricated on said first W layer; and
    a second W layer fabricated on said second CrMo layer.

18. The disk drive of claim 17, wherein;
    said magnetic head is a perpendicular head.

19. The disk drive of claim 17, wherein;
    said magnetic head is a longitudinal head.

20. A method for fabricating a coercivity hard bias layer for a magnetic read head, comprising:
    A) fabricating a bi-layer seedlayer, including:
       i) fabricating a first CrMo layer; and
       ii) fabricating a first W layer on said first CrMo layer; and
    B) fabricating a hard bias layer on said first W layer.

21. The method for fabricating a coercivity hard bias layer of claim 20, wherein A further comprises:
    iii) fabricating a second CrMo layer on said first W layer and
    iv) fabricating a second W layer on said second CrMo layer.

22. A method for fabricating an improved coercivity hard bias layer for a magnetic read head, comprising:
    A) fabricating a first CrMo layer;
    B) fabricating a first W layer on said first CrMo layer;
    C) fabricating a second CrMo layer on said first W layer;
    D) fabricating a second W layer on said second CrMo layer; and
    E) fabricating a hard bias layer on said second W layer.

* * * * *